United States Patent [19]

Hale

[11] Patent Number: 4,580,654

[45] Date of Patent: Apr. 8, 1986

[54] PORTABLE SOUND SPEAKER SYSTEM

[76] Inventor: James W. Hale, 2015 St. Andrews Rd., Jeffersonville, Ind. 47130

[21] Appl. No.: 708,182

[22] Filed: Mar. 4, 1985

[51] Int. Cl.[4] .............................................. H05K 5/00

[52] U.S. Cl. .................................... 181/146; 181/151; 181/153; 181/155; 181/199

[58] Field of Search ................................ 181/144–147, 181/153, 199, 155, 151

[56] References Cited

U.S. PATENT DOCUMENTS

| | | | |
|---|---|---|---|
| 2,896,737 | 7/1959 | Gellman | 181/153 |
| 3,371,742 | 3/1968 | Norton et al. | 181/153 |
| 3,443,660 | 5/1969 | Virva et al. | 181/153 X |
| 3,945,461 | 3/1976 | Robinson | 181/153 |
| 3,978,941 | 9/1976 | Siebert | 181/153 X |
| 4,348,549 | 9/1982 | Berlant | 181/155 X |
| 4,365,114 | 12/1982 | Soma | 181/144 X |
| 4,440,259 | 4/1984 | Strohbeen | 181/153 X |

FOREIGN PATENT DOCUMENTS

| | | | |
|---|---|---|---|
| 143597 | 9/1951 | Australia | 181/153 |

*Primary Examiner*—Benjamin R. Fuller

*Attorney, Agent, or Firm*—Richard L. Caslin

[57] ABSTRACT

This portable sound speaker system has an elongated cylinder supporting a layer of acoustically absorbent material lining the interior surface thereof. The cylinder has an open, raised platform as its support in a vertical position, where the platform has a first base plate carrying a plurality of spacers on which is fastened a second plate having a large central hole open to the interior of the cylinder to allow the bass sound to radiate radially outward therefrom. A first, low frequency loudspeaker is fitted down into the upper end of the cylinder, and it radiates upwardly. A second, high frequency loudspeaker is mounted above the first loudspeaker, and it radiates in a generally horizontal direction. A cylindrical speaker grille is fitted over the second loudspeaker and mounted to the top end of the cylinder.

4 Claims, 3 Drawing Figures

PORTABLE SOUND SPEAKER SYSTEM

BACKGROUND OF THE INVENTION

1. Field of the Invention

This invention relates to the art of tubular speakers for use in a stereo system for radiating acoustic output throughout a wide angle in generally horizontal planes so as to provide maximum sound in a minimum floor space.

2. Description of the Prior Art

The Gellman U.S. Pat. No. 2,896,737 describes an extension loudspeaker for radio, television receivers, phonographs, and the like. It has a tubular casing supporting a conventional cone-type speaker mounted intermediate the length thereof. This speaker is either mounted horizontally on a supporting surface, or it may be mounted vertically on a vertical wall surface. Apparently, the main invention of this patent is the adjustability of the support legs.

The Virva et al. U.S. Pat. No. 3,443,660 describes a mid-range speaker and enclosure combination which comprises a cardboard cylindrical enclosure supporting a soft cone, mid-range loudspeaker mounted in one end thereof. The speaker has a rigid frame with a drum portion at the rear, and the cylindrical enclosure is frictionally secured to the loudspeaker by forcing it over the drum portion to form a substantially airtight seal. The length of this cylindrical enclosure is approximately equal to one-fourth the wave length of the natural resonant frequency of the loudspeaker, thereby providing a substantially tuned enclosure.

The Robinson U.S. Pat. No. 3,945,461 describes a sound speaker system having an elongated vertical cylinder that is open at both ends. A secondary cylinder is telescopically fitted with the lower end of the cylinder. The lower end of the secondary cylinder is mounted on a flat, horizontal, annular surface which is supported on vertical legs from the floor. The speaker is mounted in the central opening of the annular member facing downwardly. There are three adjustable stop means for positioning the upper cylinder with respect to the lower, secondary cylinder. This loudspeaker system is designed to be placed in the corner of a room so that sound emanating from the lower and upper ends is reflected by the floor and ceiling corners respectively into the room.

The Siebert U.S. Pat. No. 3,978,941 describes a cylindrical speaker enclosure for providing an acoustically balanced output with improved audio quality at low level reproduction. The speaker is mounted intermediate the ends of the tubular speaker. The inner walls of the tubular shelf are covered with an acoustically absorbent material. At the bottom end of the cylindrical shell is an annular plate which serves as an elastic diaphragm forming a closure across the bottom end of the shell chamber. There is a venting tube vertically disposed over the central opening in this annular plate which allows for the transfer of air from the inside of the chamber to the outer atmosphere. This speaker enclosure is mounted above a surface so that the elastic diagragm on the bottom is not directly contacting a supporting surface.

The Berlant U.S. Pat. No. 4,348,549 describes a loudspeaker system for radiating acoustic output throughout 360 degrees, in generally horizontal planes, comprising a tubular enclosure having a polygonal cross section (rectangular). There is an upper tweeter assembly mounted in the upper end of the rectangular enclosure, and a lower woofer assembly, including a speaker with a conical diaphragm mounted at the lower base of this enclosure. A down-turned conical member is positioned at the top of the speaker, above the tweeter, for changing the direction of the radiated acoustic energy in the horn by an angle of approximately 90 degrees.

The Australian Pat. No. 143,597 describes a loudspeaker unit having a hollow column formed by a semicircular arcuate member of plywood forming about 240 degrees of a circle, and a somewhat curved panel of plywood closing the gap. A series of radially-spaced vertical feet support this column, and a conventional cone loudspeaker is mounted on a baffle at the top of the column. A lining of sound-absorbing material is fitted on the interior of the column for reflecting sound waves from the speaker in a substantially horizontal direction.

OBJECTS OF THE PRESENT INVENTION

The principal object of the present invention is to provide a sound speaker system which provides the best quality of sound while requiring the least floor space and which is easily movable.

A further object of the present invention is to provide a portable sound speaker system utilizing an elongated cylindrical enclosure, where both the high and low frequency loudspeakers are mounted in an elevated position, while the lower end of the cylinder radiates the bass sound in all directions.

A further object of the present invention is to provide a portable sound speaker system of the class described which has a handle hidden on the rear side thereof in a balanced position so that one hand can carry this speaker from place to place.

BRIEF DESCRIPTION OF THE DRAWINGS

This invention will be better understood from the following description taken in conjunction with the accompanying drawings, and its scope will be pointed out in the appended claims.

DESCRIPTION OF THE PREFERRED EMBODIMENTS

Figure 1:
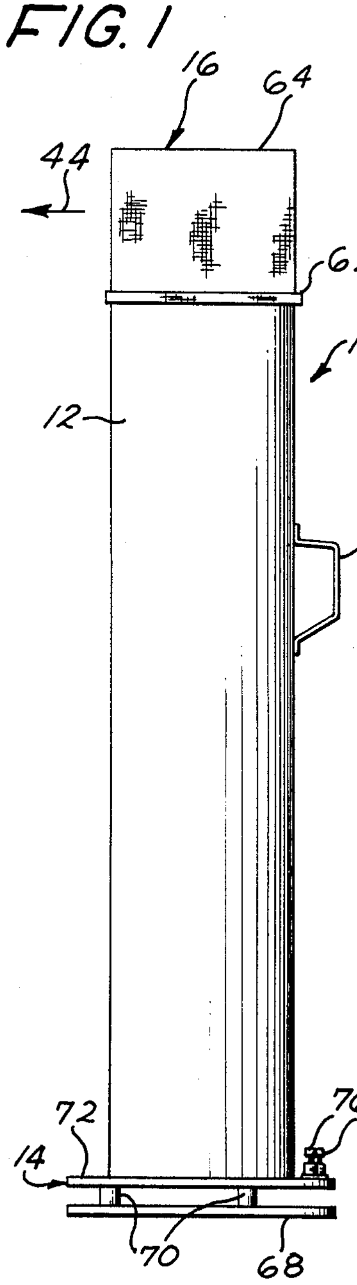
FIG. 1 is a left side elevational view of a portable sound speaker system comprising the present invention showing an elongated cylindrical enclosure supported on an open, raised platform and having a cylindrical speaker grille mounted on the top of the enclosure, with a single rear handle.

Turning now to a consideration of the drawings, and, in particular, to the left side elevational view of FIG. 1, there is shown a portable sound speaker system 10 comprising the present invention. This speaker system includes an elongated cylindrical enclosure 12 that is supported on an open, raised platform 14 so as to stand in a generally vertical position. The top portion of the cylindrical enclosure is fitted with a cylindrical speaker grille 16.

Figure 2:
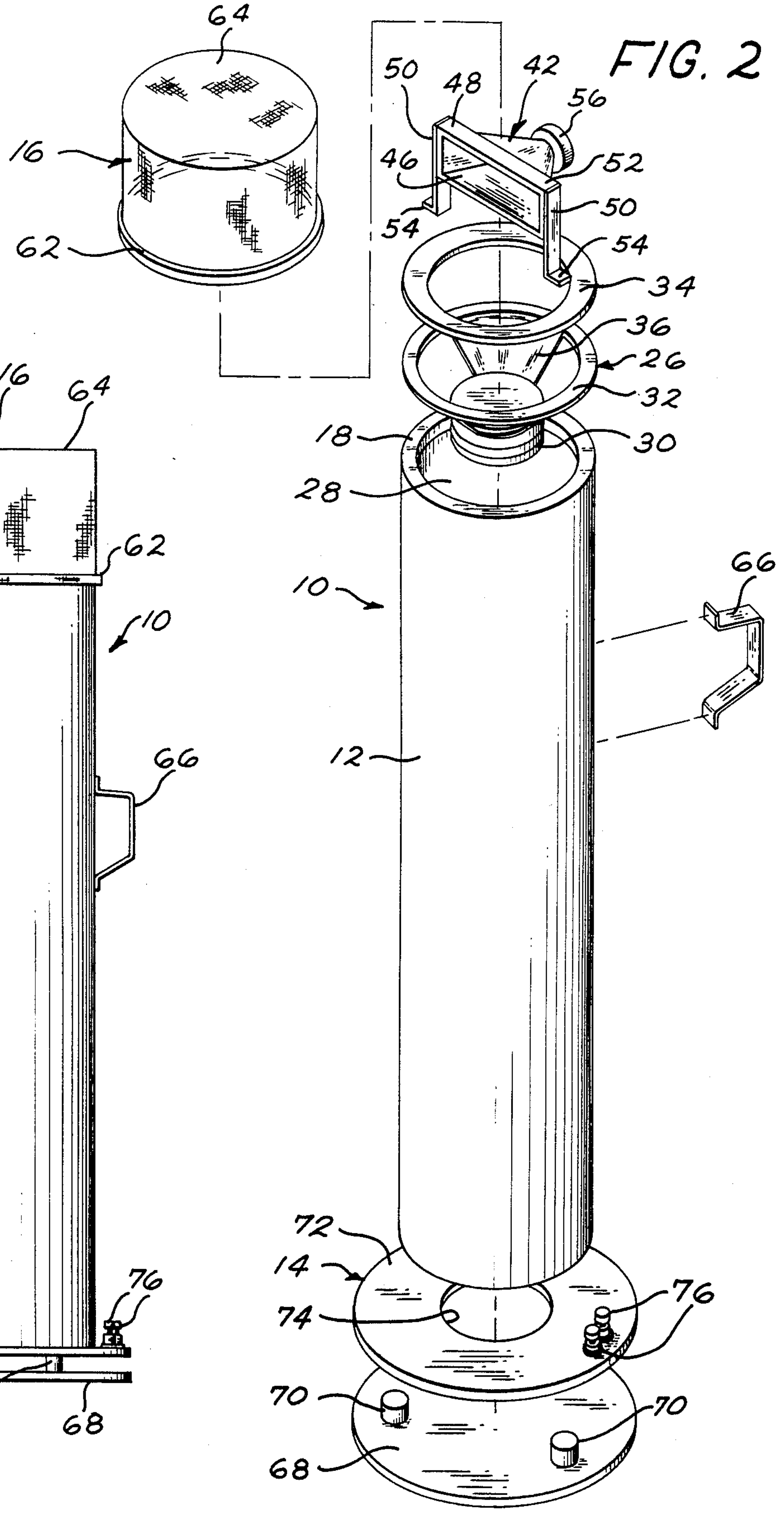
FIG. 2 is an exploded perspective view of the portable sound speaker system of FIG. 1, shown on an enlarged scale, with most of the elements separated from each other to better show their details of construction.
Figure 3:
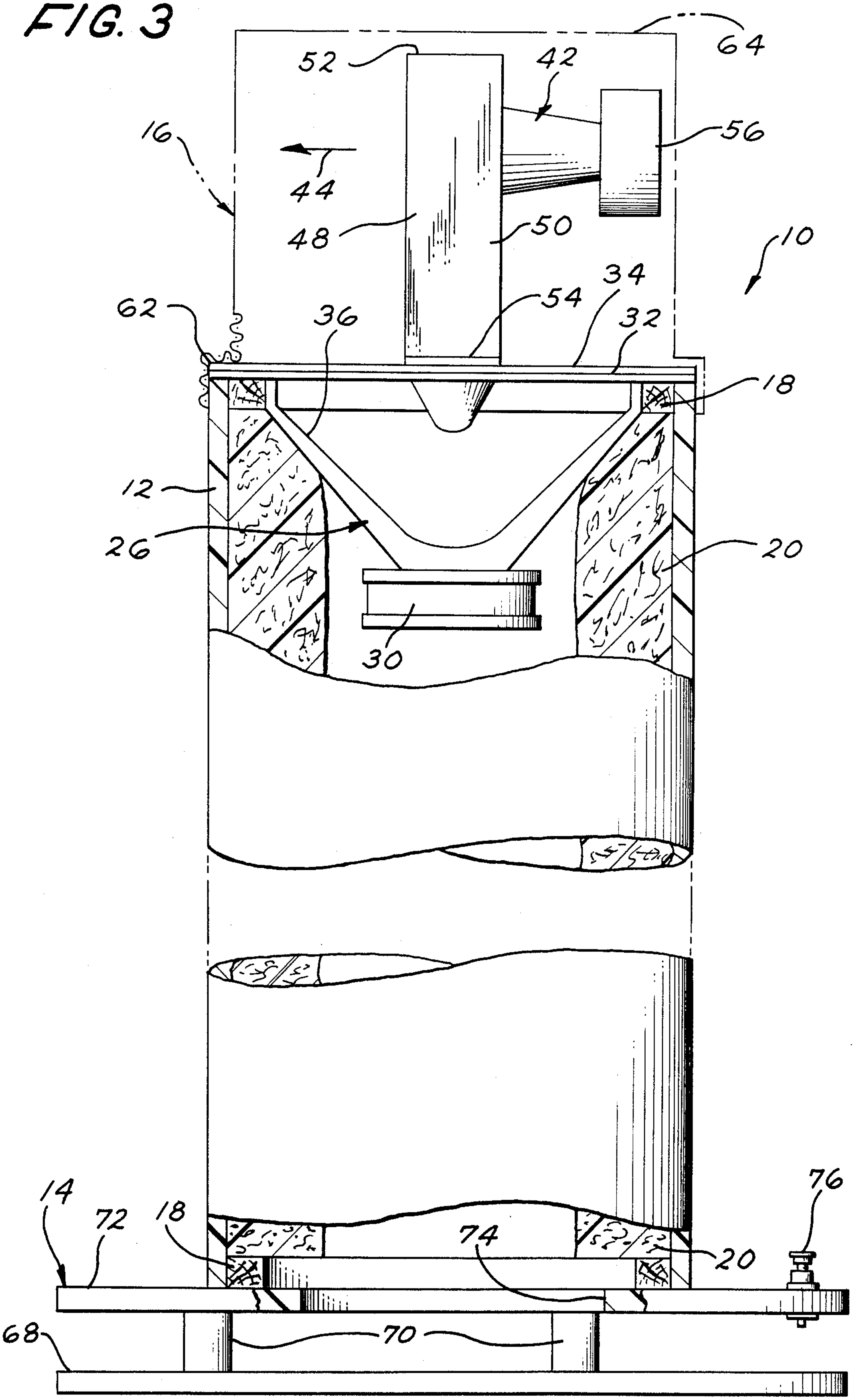
FIG. 3 is a left side elevational view, on an enlarged scale, similar to that of FIG. 1, with some parts broken away and others in cross section in order to understand the details of construction.

For a more detailed explanation of the present invention, attention will now be directed to the exploded perspective view of FIG. 2. The elongated cylindrical enclosure 12 is preferably formed of an 8-inch diameter plastic tube that is about 4 feet high. It is possible that thin wood or strong cardboard could also be used to form this cylindrical enclosure, but the preferred embodiment is a thin plastic wall tube 12. This tube may be sanded and painted whatever color is desired. A small wooden ring 18 is glued in both the top and bottom ends of this tube 12 to form a mounting flange. As best seen in FIG. 3, a thick layer of acoustically absorbent material 20 lines the interior surface of the cylindrical enclosure 12.

An 8-inch, low frequency loudspeaker, or woofer 26, is fitted down into the upper end 28 of the cylindrical enclosure so that the sound from this woofer radiates upwardly. This woofer assembly 26 is a conventional speaker having an electro-mechanical vibrating means, such as the electro-magnet coil 30. There is a circumferential speaker frame 32 that is adapted to be seated to the upper flange 18 of the cylindrical enclosure 12. An appearance ring 34 is placed over the upper surface of the circumferential frame 32. A conventional speaker diaphragm 36 is connected between the circumferential speaker frame 32 and the electro-magnet coil 30.

A relatively small, high frequency loudspeaker or tweeter 42 is mounted above the woofer 26, and it radiates in a generally horizontal direction, as shown by the directional arrow 44. This tweeter 42 has a speaker opening 46 that is generally rectangular and about three times as wide as it is high. A mounting bracket 48 of sheet metal material is used for supporting this tweeter 42 in a raised position above the upper end 28 of the cylinder, as is best seen in FIG. 3. This bracket 48 is generally of down-turned U-shape, having a pair of parallel vertical legs 50 which are joined at the top by a horizontal strap 52. The bottom end of each vertical leg 50 is fitted with a support foot 54, which includes a mounting hole for receiving a fastening screw (not shown). This mounting bracket 48 may be crimped to the front end of the speaker 42 or attached in any other conventional manner. Element 56 is an electro-magnet coil for this tweeter 42.

In order to enhance the appearance of the top portion of this speaker 10, a cylindrical speaker grille 16 is positioned over the tweeter 42, as well as over the open end 28 of the cylinder 12, as is best seen in FIG. 1. This cylindrical speaker grille 16 is open at the bottom, and it has a circumferential mounting flange 62 at its bottom edge for telescopically engaging the top edge of the cylindrical enclosure 12, as is best seen in FIG. 3. This cylindrical grille 16 is formed of screen wire of sufficient rigidity to maintain its shape, while the top portion 64 of the grille is formed of cloth. The entire cylindrical speaker grille 16 is provided with a flat black color.

As best seen in FIG. 1, which shows a left side elevational view of this portable sound speaker system 10, a single handle 66 is shown on the rear side of the cylindrical enclosure 12, it being understood that the direction 44 in which the tweeter 42 is directed is considered to be the front of this speaker system 10. In other words, the single handle 66 is opposite the front of this speaker so that it is generally out of view during use. This single handle 66 is attached to the rear side of the cylindrical enclosure 12 at a location above the mid-height of the speaker so that the weight of the entire speaker system is generally balanced on the two sides of the handle when the speaker is held by the handle in a generally horizontal position when carrying the speaker from one place to the other. A suitable fastening means (not shown) would be used to fasten this handle to the cylindrical enclosure 12.

Attention will now be directed to the lower end of the speaker 10, as shown in FIG. 2. The open, raised platform 14 is shown separated from the lower end of the cylindrical enclosure 12. This platform is created by a combination of a first supporting base plate 68, which is a thin plate of circular shape that is larger in diameter than the cylindrical enclosure 12. This base plate supports a plurality of widely spaced spacers 70 which are made integral with the base plate 68. On top of these spacers is positioned a second plate 72 which has generally the overall shape of the first plate 68. This second plate 72 is made integral with the spacers 70 as well as being integral with the lower wooden ring 18 by use of fastening screws or the like (not shown), as is best seen in FIG. 3. Actually, in assembly, the second plate 72 would first be screwed to the ring 18, and then the spacers 70 would be glued to the underside of the second plate, and then the base plate 68 would be glued to the underside of the spacers 70. Of course, other assembly means may be used without departing from the scope of the present invention. Notice, in FIG. 2, that the second plate 72 has a large central hole 74 that is open to the interior of the bottom end of the cylindrical enclosure 12 so as to allow the bass sound out of the enclosure and out of the open, raised platform 14. A pair of screw terminals 76 are mounted through the second plate 72 so that the wires from the screw terminals to the two speakers 26 and 42 would be mounted on the underside of this second plate and out of view. The user would connect from his stereo player (not shown) to these speakers by connecting lead wires to the screw terminals 76. The actual circuit between the screw terminals and the two speakers is not shown since it is conventional and does not form part of the present invention. In actual use, these screw terminals 76 are located at the rear of the speaker, generally under the handle 66, but, in FIG. 2, the second plate 72 has been rotated clockwise a small amount so as to better illustrate the construction of these two screw terminals 76.

Modifications of this invention will occur to those skilled in the art. Therefore, it is to be understood that this invention is not limited to the particular embodiments disclosed, but that it is intended to cover all modifications which are within the true spirit and scope of this invention as claimed.

What is claimed is:

1. A portable sound speaker system comprising:

a. an elongated cylindrical enclosure body that is open at the opposite ends, a layer of acoustically absorbent material lining the interior surface of the cylindrical enclosure b. a first, low frequency loudspeaker fitted within the open upper end of the cylindrical enclosure and radiating sound waves upwardly and outwardly;

c. a second, high frequency loudspeaker diametrically mounted in an elevated position to the upper end of the cylindrical enclosure above the said first loudspeaker and radiating sound waves in a generally horizontal unidirection; and d. a cylindrical speaker grille of inverted pan shape mounted to the top end of the cylindrical enclosure and encompassing the said second, high frequency loudspeaker as well as the top end of the cylindrical enclosure;

e. and a supporting platform mounted to the lower end of the cylindrical enclosure and adapted for supporting this sound speaker system in a vertical position from an underlying supporting surface, said platform comprising a lower base plate and a spaced upper plate with an enlarged opening that communicates with the open bottom end of the cylindrical enclosure, and a plurality of widely spaced spacers separating the base plate from the upper plate and forming an open raised platform that allows the bass sound waves to radiate radially outward from between the spaced base plate and the upper plate.

2. The invention as recited in claim 1 wherein the length of the elongated cylindrical enclosure is about 6 times the diameter of this enclosure, and the supporting platform is larger in size than the diameter of the vertical cylindrical enclosure.

3. The invention as recited in claim 1 wherein the said first, low frequency loudspeaker is a woofer which substantially fills the open upper end of the cylindrical enclosure, while the said second, high frequency loudspeaker is a tweeter having a raised, inverted, U-shaped bracket supporting the tweeter in a fixed elevated position substantially across the center of the top opening of the cylindrical enclosure, where the high frequency sound waves are directed in a single direction that is generally perpendicular to the longitudinal axis of the cylindrical enclosure.

4. The invention as recited in claim 3 wherein the said cylindrical enclosure has a handle fitted to one outer side thereof that is located at the rear side of the said tweeter that is generally opposite the single direction of the sound waves radiating from the tweeter, said handle being located nearer to the upper end of the cylindrical enclosure so that the handle is generally balanced with respect to the weight of the speaker system at each end of the handle, where the handle is capable of use for ease in transporting the portable sound speaker system from place to place in a horizontal carrying position.

* * * * *